(12) United States Patent
Kim et al.

(10) Patent No.: US 8,325,075 B2
(45) Date of Patent: Dec. 4, 2012

(54) DIGITAL-TO-ANALOG CONVERTER OF DATA DRIVER AND CONVERTING METHOD THEREOF

(75) Inventors: Ji Hun Kim, Daejeon-si (KR); Joon Ho Na, Daejeon-si (KR); Kyu Sung Park, Daegu-si (KR); Gyu Hyeong Cho, Daegu-si (KR)

(73) Assignee: Silicon Works Co., Ltd., Daejeon (KR)

( * ) Notice: Subject to any disclaimer, the term of this patent is extended or adjusted under 35 U.S.C. 154(b) by 114 days.

(21) Appl. No.: 13/024,848

(22) Filed: Feb. 10, 2011

(65) Prior Publication Data
US 2011/0199248 A1 Aug. 18, 2011

(30) Foreign Application Priority Data

Feb. 12, 2010 (KR) .................. 10-2010-0013549

(51) Int. Cl.
*H03M 1/66* (2006.01)
(52) U.S. Cl. ...................... 341/145; 341/144

(58) Field of Classification Search ........... 341/144–145
See application file for complete search history.

(56) References Cited

U.S. PATENT DOCUMENTS

| | | | | |
|---|---|---|---|---|
| 5,877,717 | A * | 3/1999 | Tu et al. ................. | 341/150 |
| 6,346,899 | B1 * | 2/2002 | Hadidi ................... | 341/144 |
| 6,556,162 | B2 * | 4/2003 | Brownlow et al. ........ | 341/145 |
| 7,286,071 | B1 * | 10/2007 | Hsueh et al. ............ | 341/145 |

* cited by examiner

*Primary Examiner* — Khai M Nguyen
(74) *Attorney, Agent, or Firm* — Kile Park Goekjian Reed & McManus PLLC

(57) ABSTRACT

A digital-to-analog converter of a data driver and a converting method thereof, in which information corresponding to a lower bit is converted into an analog signal through control of current transmission paths and control of a transconductance ratio. Input data corresponding to a lower bit is converted into an analog signal through control of current transmission paths and control of a transconductance ratio between a delta current generation section and an output buffer amplifier. As a consequence, not only the area of a data driver can be significantly reduced, but also the delta current generation section can be realized even without using a common node feedback circuit, whereby an additional increase in area is not caused.

18 Claims, 5 Drawing Sheets

| Bits | Required Accuracy (%) | Ao (㎛²) |
|---|---|---|
| 3 | 3.1 | 72 |
| 2 | 6.3 | 27 |
| 1 | 12.5 | 21 |
| 0 | 25 | 15 |

DIGITAL-TO-ANALOG CONVERTER OF DATA DRIVER AND CONVERTING METHOD THEREOF

BACKGROUND OF THE INVENTION

1. Field of the Invention

The present invention relates to a digital-to-analog converter of a data driver for a display device and a converting method thereof, and more particularly, to a digital-to-analog converter of a data driver and a converting method thereof, in which information corresponding to a lower bit is converted into an analog signal through control of current transmission paths and control of a transconductance ratio.

2. Description of the Related Art

A liquid crystal display (LCD) is one of flat panel displays in which image data is displayed by passing light through liquid crystals using a characteristic that an aligned state of liquid crystal molecules is changed depending upon an applied voltage.

FIG. 1 is a block diagram illustrating the configuration of a conventional liquid crystal display device.

Referring to FIG. 1, a conventional liquid crystal display device includes a timing controller 10, a data driver 20, a gate driver 40, and a panel 30.

The timing controller 10 is configured to transfer timing signals (such as a clock signal, a horizontal synchronization signal, a vertical synchronization signal, a data enable signal, etc.) for controlling the gate driver 40 and the data driver 20 and RGB data signals to the data driver 20 and the gate driver 40.

The data driver 20 is configured to receive the RGB data outputted from the timing controller 10 and data driver control signals and output data to the panel 30 by the unit of line in response to the horizontal synchronization signal.

The gate driver 40 is configured to receive gate driver control signals which are outputted from the timing controller 10 and drive a plurality of gate lines. The gate driver 40 controls the gate lines in order to sequentially output the data outputted from the data driver 20 to the panel 30.

FIG. 2 is a view illustrating an exemplary data driver of the liquid crystal display device shown in FIG. 1.

Referring to FIG. 2, a data driver 21 includes a control section 300 for transferring timing control signals, a shift register section 310, a data register section 320, a latch section 330, a level shifter (not shown), a digital-to-analog converter 340, and an output buffer 350.

The control section 300 is configured to receive a clock signal CLK and timing control signals LOAD and POL from an outside, supply the clock signal CLK to the shift register section 310, and transfer the timing control signals LOAD and POL to the latch section 330 and the output buffer 350.

The data register section 320 is configured to output RGB data signals to the latch section 330 based on the inputted clock signal. Meanwhile, the shift register 310 is configured to sequentially perform a shifting operation for the inputted clock signal and output the shifted clock signal to the latch section 330.

The latch section 330 is configured to latch and store the RGB data signals based on the shifted clock signal.

The level shifter (not shown) is configured to raise the digital voltage stored in the latch section 330 to an analog voltage range and output the resultant signal to the digital-to-analog converter 340. The digital-to-analog converter 340 is configured to receive digital data corresponding to each line of the stored image from the level shifter, convert the digital data into analog data using a gamma reference voltage which is independent for respective channels, and output the analog data to the output buffer 350.

The output buffer 350 is configured to output the analog data converted by the digital-to-analog converter 340 to the panel 30 in response to data driver control signals.

FIG. 3 is a view illustrating a digital-to-analog converter used in the data driver shown in FIG. 2.

Referring to FIG. 3, the conventional digital-to-analog converter 340 includes resistor strings and switches. The resistor strings supply gray-scale voltages, and the switches select the gray-scale voltages depending upon the data inputted thereto and output the gray-scale voltages to the output buffer 350. However, in the conventional digital-to-analog converter which uses the resistor strings, if the number of digital bits of data is increased, problems are caused in that the number of switches increases by geometric progression and the area of an entire circuit increases.

That is to say, since an area increases $2^N$ times when data increases by N bits, in order to apply a digital-to-analog converter to an application field of a data driver with a high gray scale, it is necessary to reduce the area of the digital-to-analog converter. Accordingly, in order to reduce the area of the digital-to-analog converter, an interpolation method has been suggested in the art.

FIG. 4 is a configuration diagram illustrating a conventional interpolation type digital-to-analog converter.

Referring to FIG. 4, a conventional interpolation type digital-to-analog converter includes an analog gray-scale voltage generation stage 410, a first decoder 420, a second decoder 430, and an interpolated voltage generation stage 440.

The analog gray-scale voltage generation stage 410 is constituted by a string of a plurality of resistors which are connected in series between VgammaH and VgammaL, and is configured to generate analog gray-scale voltages of $2^K$ (=J) levels through division by the respective resistors.

The first decoder 420 is configured to generate a first level voltage Vh and a second level voltage Vl among the analog gray-scale voltages of $2^K$ (=J) levels in response to image data of upper K bits among entire image data of N bits (for example, 8 or 10 bits).

The second decoder 430 is configured to divide the first level voltage Vh and the second level voltage Vl in response to image data of remaining lower L bits among the entire image data of N bits and output M number of divided outputs.

The interpolated voltage generation stage 440 is configured to generate interpolated voltages corresponding to the M number of divided outputs and drive the data lines of a panel.

In such an interpolation method, in the case of the upper K bits among the entire N bits of digital image data, representative gray-scale voltages are selected by a digital-to-analog converter structure using the existing resistor string, and in the case of the remaining lower L bits, divided output voltages are generated by dividing the selected gray-scale voltages through interpolation.

However, in such a conventional interpolation type digital-to-analog converter, as the number of the lower L bits to be interpolated increases, the linearity of an output voltage deteriorates, and therefore, it is difficult to decrease the number of upper K bits for outputting voltages through the resistor string to or below 8 bits. As a consequence, a problem is caused in that it is necessary to provide additional transistors on an input side.

SUMMARY OF THE INVENTION

Accordingly, the present invention has been made in an effort to solve the problems occurring in the related art, and an object of the present invention is to provide a digital-to-analog converter of a data driver and a converting method thereof, in which input information corresponding to a lower bit is converted into an analog signal through control of current transmission paths and control of a transconductance ratio between a delta current generation section and an output buffer amplifier so that the area of a data driver can be reduced.

In order to achieve the above object, according to one aspect of the present invention, there is provided a digital-to-analog converter of a data driver, including: a decoder configured to output a first level voltage and a second level voltage in response to input image data of upper K bits (K is a natural number less than N) among input image data of N bits (N is a natural number equal to or greater than 2); a delta current generation section configured to receive the first level voltage and the second level voltage and generate two currents; two transmission lines configured to transmit the two currents generated by the delta current generation section; a current digital-to-analog conversion section configured to divide one current of the two currents generated by the delta current generation section, in response to input image data of 2 least significant bits among remaining lower L bits (L=N−K); an output buffer amplification section configured to be applied with the other current of the two currents generated by the delta current generation section and a current outputted from the current digital-to-analog conversion section and generate an output voltage; a switch section configured to control currents of the transmission lines depending upon input information; and two multipliers configured to control transmission paths of the two currents generated by the delta current generation section.

In order to achieve the above object, according to another aspect of the present invention, there is provided a digital-to-analog converting method of a data driver, including the steps of: outputting a first level voltage and a second level voltage in response to input image data of upper K bits (K is a natural number less than N) among input image data of N bits (N is a natural number equal to or greater than 2); receiving the first level voltage and the second level voltage and generating a negative output current and a positive output current; transmitting one current of the negative output current and the positive output current through a first transmission line; transmitting the other current of the negative output current and the positive output current through a second transmission line, by dividing the other current depending upon input image data of remaining lower L bits (L=N−K) through a current digital-to-analog converter; and receiving the first level voltage or the second level voltage, adding the first level voltage or the second level voltage with a voltage which is interpolated by the currents transmitted through the first transmission line and the second transmission line, and generating an output voltage.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
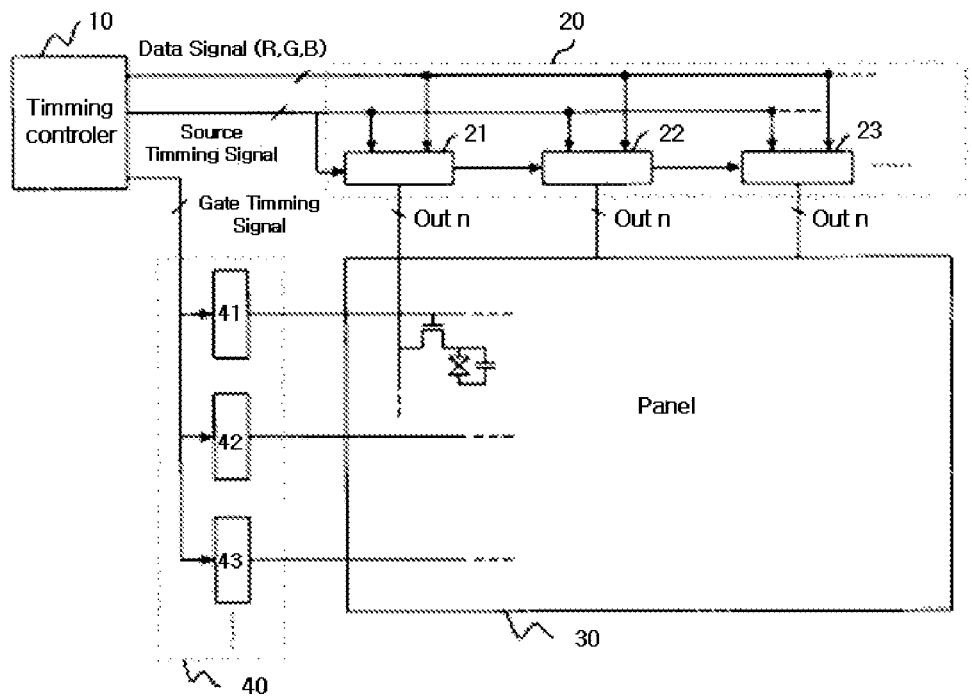
FIG. 1 is a block diagram illustrating the configuration of a conventional liquid crystal display device.
Figure 2:
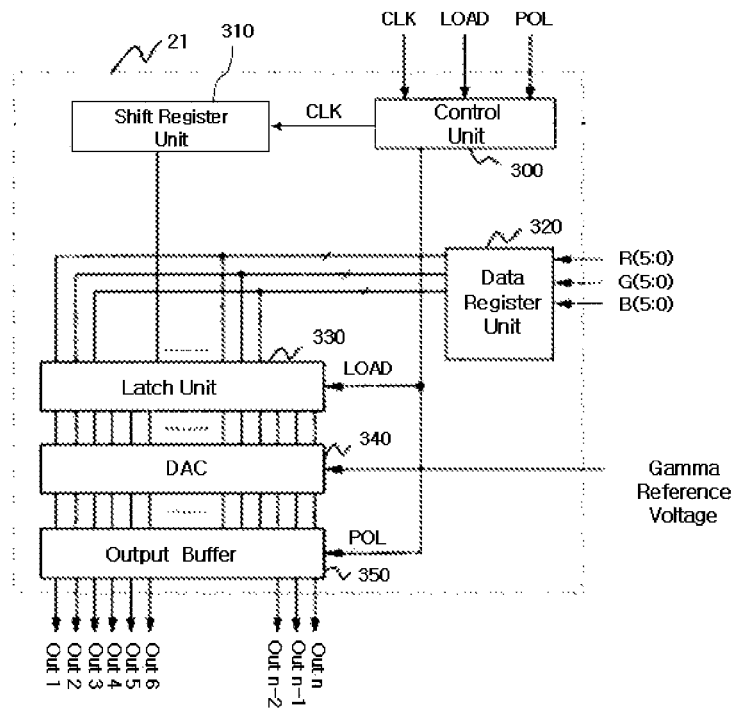
FIG. 2 is a view illustrating an exemplary data driver of the liquid crystal display device shown in FIG. 1.
Figure 3:
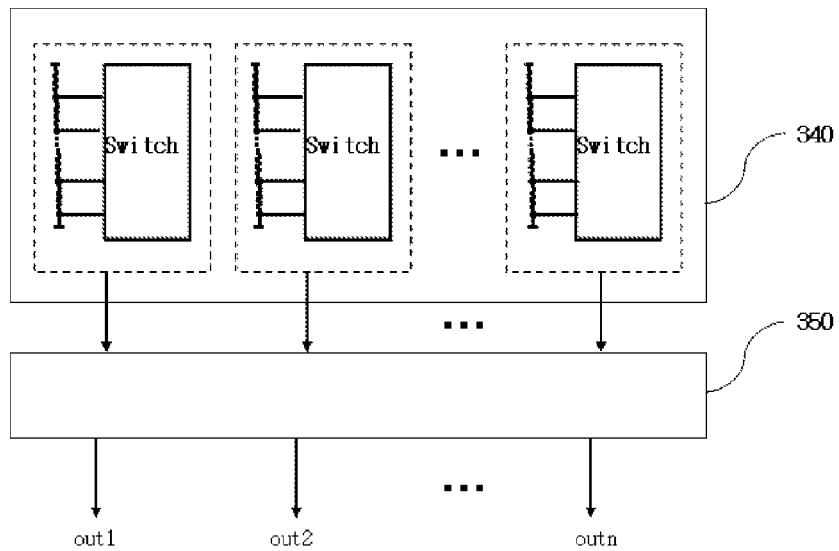
FIG. 3 is a view illustrating a digital-to-analog converter used in the data driver shown in FIG. 2.
Figure 4:
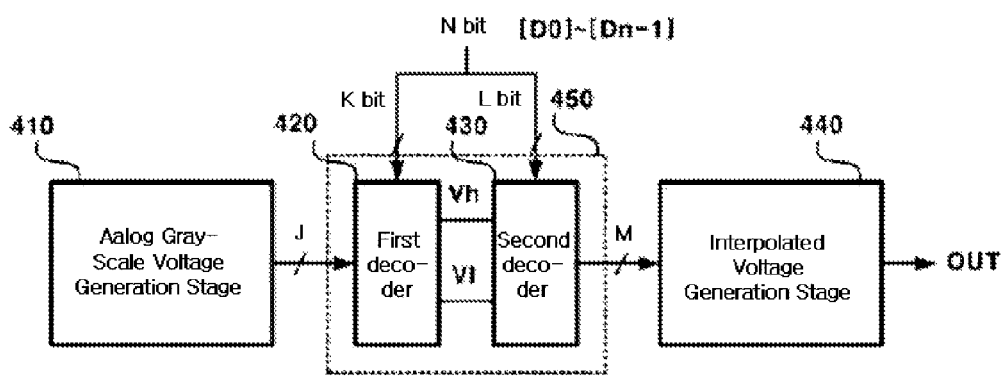
FIG. 4 is a configuration diagram illustrating a conventional interpolation type digital-to-analog converter.

In the present invention, for upper K bits among entire N bits, a gray-scale voltage is outputted using a decoder which employs a resistor string, and for the remaining lower L bits, a gray-scale voltage is interpolated using a delta current generation section and a digital-to-analog converter employing a current and an interpolated voltage is outputted. In this way, gray scales of the entire bits are displayed.

When assuming that entire bits are 10 bits, a resistor string takes charge of upper 6 bits, and the remaining lower 4 bits (D3~D0) are interpolated, such that gray scales of total 10 bits are satisfied. At this time, in order to cope with a problem which is caused due to the fact that the linearity of an output voltage deteriorates as the number of lower bits to be interpolated increases, a current digital-to-analog converter is adopted in the present invention. That is to say, in the present invention, the current generated by the delta current generation section is applied to an output buffer amplifier by being regularly divided by the current digital-to-analog converter which ensures linearity.

While the linearity can be ensured by interpolating the lower 4 bits through a 4-bit current digital-to-analog converter, a rate at which the 4-bit current digital-to-analog converter occupies a data driver becomes substantial, which is problematic.

In the present invention, in order to address this situation, a 2-bit (D1 and D0) current digital-to-analog converter is used. The remaining lower 2 bits, which are left as the 4-bit current digital-to-analog converter is changed to the 2-bit current digital-to-analog converter, are satisfied by controlling current transmission paths through which the two currents generated by the delta current generation section are applied to the output buffer amplifier. The area of the 2-bit current digital-to-analog converter corresponds to approximately 30~40% of that of the 4-bit current digital-to-analog converter, which provides substantial advantages in terms of area.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 5A:
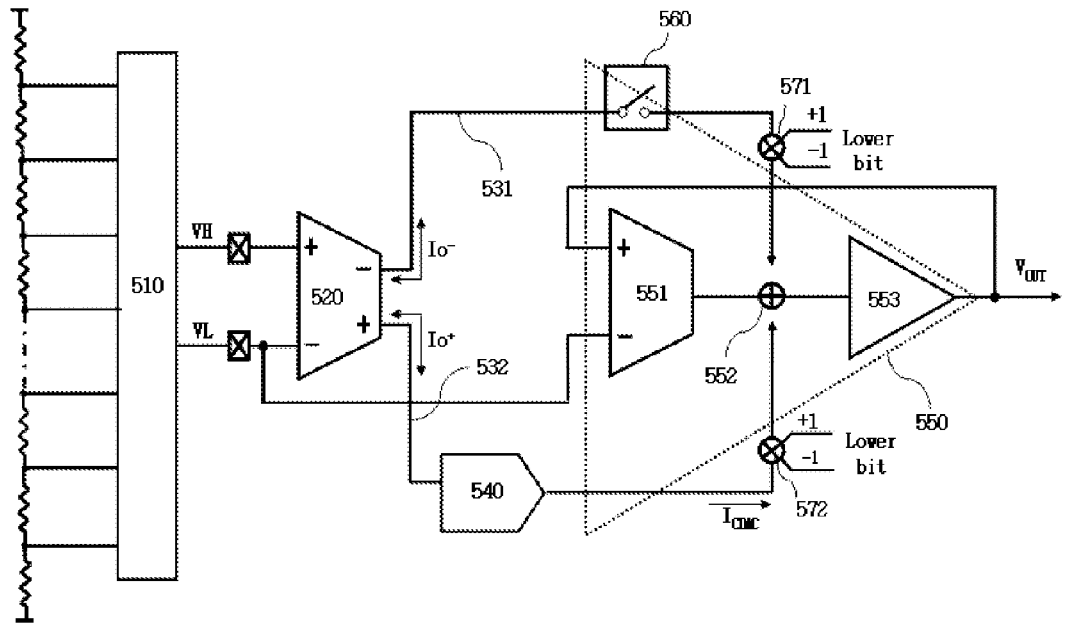
FIGS. 5a through 5b are views illustrating the configuration of a digital-to-analog converter of a data driver in accordance with an embodiment of the present invention.
Figure 5B:
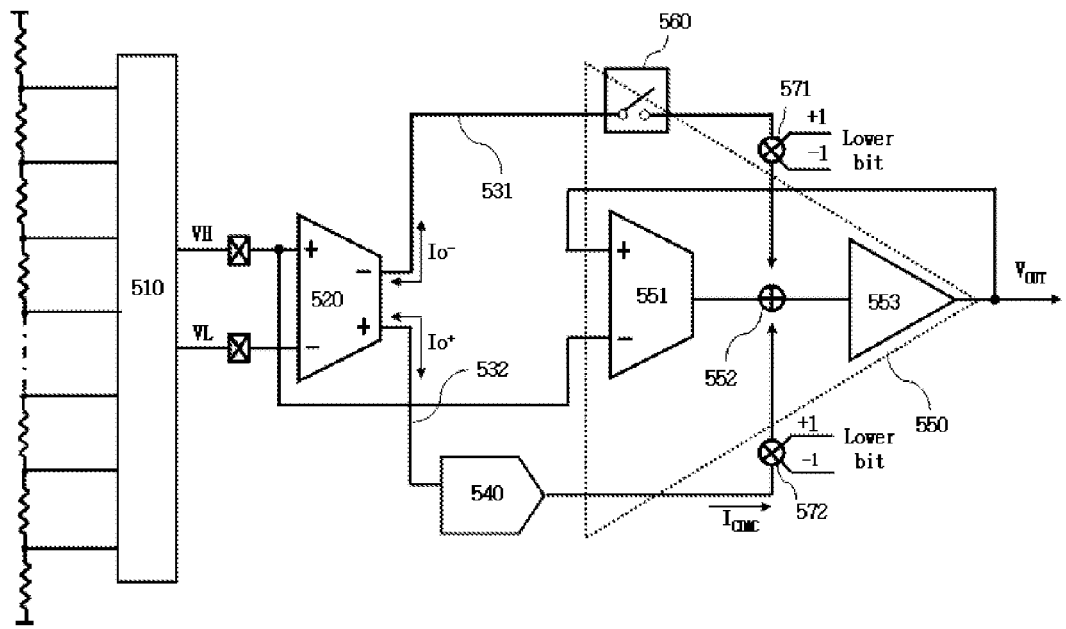

FIGS. 5a through 5b are views illustrating the configuration of a digital-to-analog converter of a data driver in accordance with an embodiment of the present invention.

FIG. 5a indicates a case in which a second level voltage VL is applied to an inverting terminal and FIG. 5b indicates a case in which a first level voltage VH is applied to the inverting terminal, in the digital-to-analog converter of a data driver in accordance with the embodiment of the present invention.

Referring to FIGS. 5a and 5b, a digital-to-analog converter of a data driver in accordance with an embodiment of the present invention includes a decoder 510, a delta current generation section 520, two transmission lines 531 and 532, a current digital-to-analog conversion section 540, an output buffer amplification section 550, a switch section 560, and two multipliers 571 and 572.

The decoder 510 is configured to output a first level voltage VH and a second level voltage VL in response to input image data of upper K bits (K is a natural number less than N) among input image data of N bits (N is a natural number equal to or greater than 2). The decoder 510 may be a 6-bit resistor string digital-to-analog converter.

The delta current generation section 520 is configured to receive the first level voltage VH and the second level voltage VL and generate two currents Io− and Io+. The delta current generation section 520 includes a first amplifier with a differential output of a predetermined transconductance gm.

The first amplifier has a first input terminal to which the first level voltage VH is applied and a second input terminal to which the second level voltage VL is applied. Also, the first amplifier has a first output terminal which generates the negative output current Io− and a second output terminal which generates the positive output current Io+.

That is to say, the structure of the delta current generation section 520 has not the type of a single-ended output amplifier but the type of a differential output amplifier. In the structure of the differential output amplifier, a common mode feedback (CMFB) should exist at an output terminal. However, in the embodiment of the present invention, the two output terminals of the delta current generation section 520 are connected to the 2-bit current digital-to-analog conversion section 540 and an adder 552 as the low impedance node of the output buffer amplification section 550, by which the common mode feedback structure is eliminated.

The two transmission lines 531 and 532 are configured to transmit the negative output current Io− and the positive output current Io+ to the output buffer amplification section 550.

The first transmission line 531 applies the negative output current Io− to the output buffer amplification section 550, and the second transmission line 532 applies the positive output current Io+ to the output buffer amplification section 550 via the current digital-to-analog conversion section 540. The first transmission line 531 performs a coarse interpolation, and the second transmission line 532 performs a fine interpolation. This will be described later in detail with reference to FIG. 7.

The current digital-to-analog conversion section 540 is configured to divide the positive output current Io+ in response to least significant 2 bits of remaining lower L bits (L=N−K) of the input image data. Accordingly, it is preferred that the current digital-to-analog conversion section 540 includes a 2-bit current digital-to-analog converter.

The output buffer amplification section 550 is configured to receive the negative output current Io− of the two currents generated by the delta current generation section 520 and a current $I_{CDAC}$ which is outputted from the current digital-to-analog conversion section 540, and generate an output voltage.

The output buffer amplification section 550 includes a second amplifier 551, the adder 552 and an internal amplifier 553.

The second amplifier 551 has an inverting terminal to which the second level voltage VL or the first level voltage VH is applied, and possesses a predetermined transconductance 2 gm. The transconductance (2 gm) of the second amplifier 551 is determined by a relationship with a transconductance (1 gm) of the first amplifier as the delta current generation section 520. It is preferred that the second amplifier 551 have a transconductance (2 gm) corresponding to two times of the transconductance (1 gm) of the first amplifier.

In the adder 552, the output of the second amplifier 551 and a voltage, which is interpolated by the current applied to or outputted from the first transmission line 531 or the second transmission line 532, are added or subtracted.

In other words, a voltage corresponding to the current applied to or outputted from the adder 552 is added to or subtracted from the output voltage of the second amplifier 551, and is then outputted as a final output voltage Vout via the internal amplifier 553.

In the case where the voltage inputted to the output buffer amplification section 550 is the second level voltage VL, a voltage increased by a voltage corresponding to the current applied to the adder 552 is outputted as the final output voltage Vout from an output terminal. Meanwhile, in the case where the voltage inputted to the output buffer amplification section 550 is the first level voltage VH, a voltage decreased by a voltage corresponding to the current outputted from the adder 552 is outputted as the final output voltage Vout.

The switch section 560 is configured to be turned on or off so as to control whether or not to transmit the negative output current Io−. Further, the first multiplier 571 and the second multiplier 572 are configured to control the transmission paths of the transmission lines depending upon input information.

Total gray-scales of 10 bits cannot be satisfied with the upper 6 bits in the decoder 510 constituted by the resistor string digital-to-analog converter and the lower 2 bits in the current digital-to-analog conversion section 540. In order to cope with this problem, a structure for controlling the delta current generation section 520 associated with a rate of a transconductance and the current transmission paths through the output buffer amplification section 550 and the transmission lines 531 and 532 has been devised.

By applying the current Io−, outputted as a negative output between the delta currents generated by the delta current generation section 520, to the output buffer amplification section 550, the output DC voltage of the output buffer amplification section 550 is shifted. By this method, a coarse voltage is secured among voltages corresponding to 4 bits, and a coarse interpolation is performed through the negative output current Io−. Through this, as the current digital-to-analog conversion section 540 is reduced by 2 bits from 4 bits, a gray scale corresponding to 1 bit of the remaining 2 bits is satisfied.

In a state in which the bias conditions of the delta current generation section 520 and the second amplifier 551 of the output buffer amplification section 550 are intentionally made different and a ratio of transconductance becomes 1:2, the transmission path of the current Io+ which is inputted through the input terminal of the current digital-to-analog conversion section 540 and is outputted through the output terminal of the current digital-to-analog conversion section 540 and the transmission path of another output current Io− of the delta current generation section 520 are changed through the first multiplier 571 and the second multiplier 572. Namely, in the case where the signals of lower bits applied to the first multiplier 571 and the second multiplier 572 have a logic high level (+1), the negative output current Io− and the positive output current Io+ are applied to the adder 552, and in the case where the signals of lower bits have a logic low level (−1), the negative output current Io− and the positive output current Io+ are outputted from the adder 552.

Through this, the output voltage of the output buffer amplification section 550 is caused to increase from the second level voltage VL as the input voltage to the output buffer amplification section 550 in a positive direction or to decrease from the first level voltage VH as the other input voltage to the output buffer amplification section 550 in a negative direction. By this fact, the remaining 1 bit gray scale can be satisfied.

In the digital-to-analog converter of a data driver in accordance with the embodiment of the present invention, by reducing a resistor string digital-to-analog converter from existing 8 bits to 6 bits, the area of the resistor string digital-to-analog converter can be decreased to ¼. Moreover, by controlling a ratio of transconductance between the delta current generation section 520 and the output buffer amplification section 550, using the 2-bit current digital-to-analog converter and controlling the current transmission paths, the area of the current digital-to-analog converter can be significantly reduced.

Also, the remaining 2 bits, which are left as the current digital-to-analog converter is reduced from 4 bits to 2 bits, enable the coarse interpolation and the fine interpolation through controlling the delta current transmission paths and the ratio of transconductance, by which the total gray scales can be satisfied.

Through these ways, the area of the digital-to-analog converter of a data driver is considerably reduced, and linearity can be ensured so that excellent performance can be obtained.

Figures 6, 7:
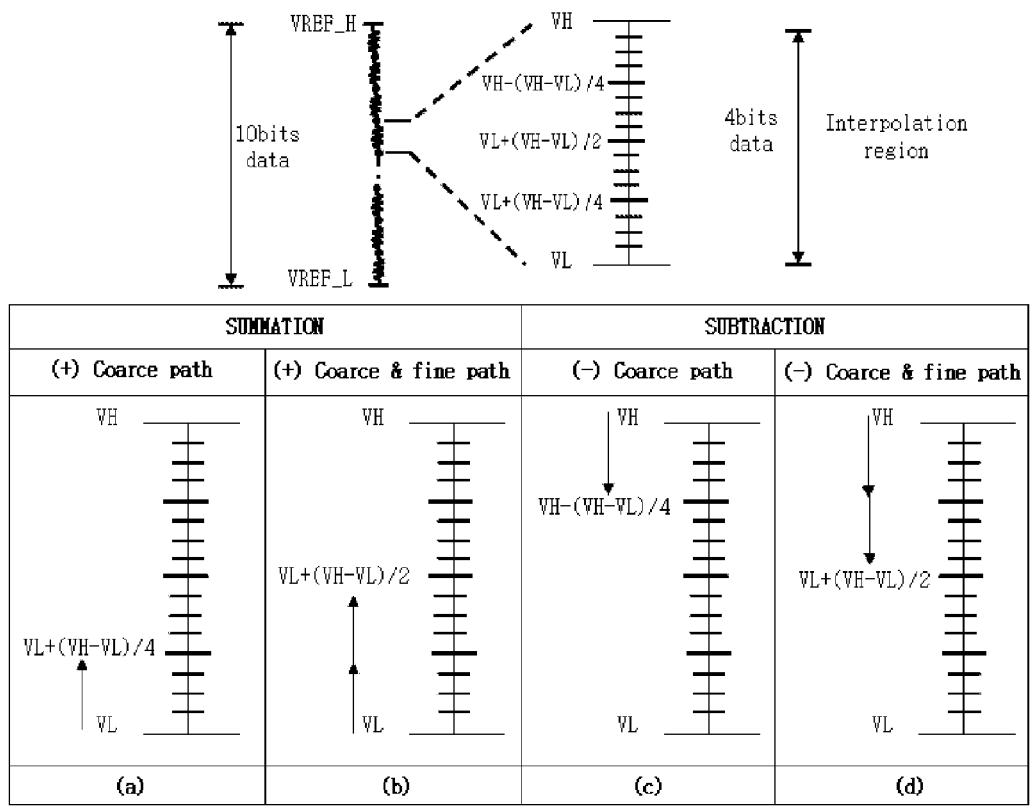
FIG. 6 is a table showing the areas of 1-bit to 4-bit current digital-to-analog converters, indicating that an area is reduced when the number of bits is decreased to 2.
FIG. 7 is a conceptual view illustrating that an output voltage is changed by changing current transmission paths in the digital-to-analog converter according to the present invention, wherein (a) shows when a coarse interpolation does not occur and a fine interpolation occurs in a positive direction according to the present invention, (b) shows when a coarse interpolation and a fine interpolation occur in a positive direction, (c) shows when a coarse interpolation does not occur and a fine interpolation occurs in a negative direction according to the present invention, and (d) shows when a coarse interpolation and a fine interpolation occur in a negative direction.

FIG. 6 is a table showing the areas of 1-bit to 4-bit current digital-to-analog converters, indicating that an area is reduced when the number of bits is decreased to 2.

FIG. 6 presents accuracies and areas required according to the bit number of a current digital-to-analog converter. Even though the bit number of the current digital-to-analog converter increases, a condition of INL<0.5 LSB should be satisfied. Therefore, as the bit number increases, a required accuracy increases, and as a required accuracy increases, an area increases.

If the 4-bit current digital-to-analog converter is changed to the 2-bit current digital-to-analog converter, an area is reduced by 60~70%. In the embodiment of the present invention, as the 2-bit current digital-to-analog converter is adopted, substantial advantages are provided in the light of reduction of area which is regarded as a big issue in a data driver.

FIG. 7 is a conceptual view illustrating that an output voltage is changed by changing current transmission paths in the digital-to-analog converter according to the present invention.

In FIG. 7, (a) shows when a coarse interpolation does not occur and a fine interpolation occurs in a positive direction according to the present invention.

A fine interpolation is performed for the second level voltage VL outputted from the 6-bit decoder 510 by the 2-bit (D1 and D0) current digital-to-analog conversion section 540. Through this, a voltage up to VL+(VH−VL)/4 is generated as an output voltage. At this time, since the switch section 560 is turned off, a coarse interpolation does not occur.

In FIG. 7, (b) shows when a coarse interpolation and a fine interpolation occur in a positive direction.

As the switch section 560 is turned on, an output DC voltage is shifted through coarse interpolation of a voltage corresponding to the remaining lower two bits (D3 and D2), to be raised from the second level voltage VL to VL+(VH−VL)/4. Thereafter, a fine interpolation is performed using the 2-bit (D1 and D0) current digital-to-analog converter, and a voltage between VL+(VH−VL)/4 and VL+(VH−VL)/2 is generated as an output voltage.

In FIG. 7, (c) shows when a coarse interpolation does not occur and a fine interpolation occurs in a negative direction according to the present invention.

In FIG. 7, (d) shows when a coarse interpolation and a fine interpolation occur in a negative direction.

(c) and (d) shows that a desired voltage is generated by reducing an output voltage in a negative direction from the first level voltage VH. The same principle as in (a) and (b) is used, and a difference resides in that an output voltage is reduced in the negative direction.

Figure 8:
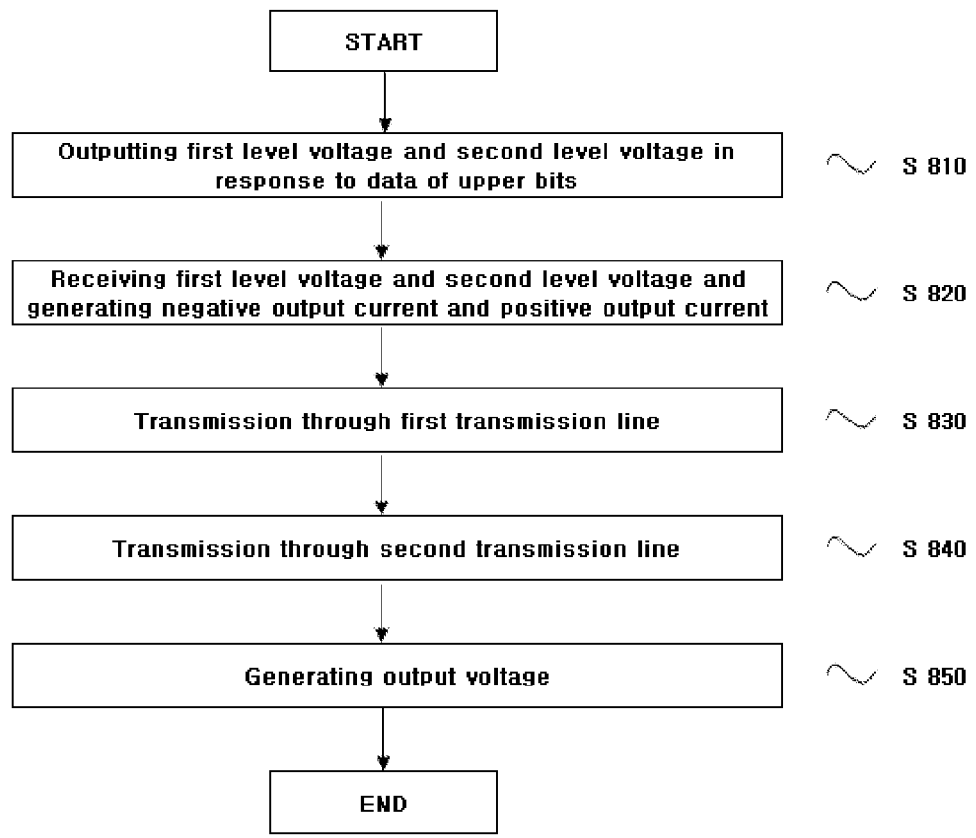
FIG. 8 is a flow chart illustrating a digital-to-analog converting method of a data driver in accordance with another embodiment of the present invention.

FIG. 8 is a flow chart illustrating a digital-to-analog converting method of a data driver in accordance with another embodiment of the present invention.

Referring to FIG. 8, a digital-to-analog converting method of a data driver in accordance with another embodiment of the present invention includes the steps of outputting a first level voltage VH and a second level voltage VL (S810), generating a negative output current and a positive output current (S820), performing transmission through a first transmission line (S830), performing transmission through a second transmission line (S840), and generating an output voltage (S850).

In the step of outputting the first level voltage VH and the second level voltage VL (S810), the first level voltage VH and the second level voltage VL are outputted in response to input image data of upper K bits (K is a natural number less than N) among input image data of total N bits (N is a natural number equal to or greater than 2). In general, in order to process input image data of upper 6 bits among input image data of 10 bits, a 6-bit resistor string digital-to-analog converter is used. Thereafter, the first level voltage VH and the second level voltage VL are received and the negative output current and the positive output current are generated (S820).

In the step of performing transmission through the first transmission line (S830), any one current of the negative output current and the positive output current is transmitted through the first transmission line. In the step of performing transmission through the second transmission line (S840), the other current of the negative output current and the positive output current is transmitted through the second transmission line by being divided depending upon input image data of least significant 2 bits among lower L bits (L=N−K) through a current digital-to-analog converter. A coarse interpolation is performed through the first transmission line, and a fine interpolation is performed through the second transmission line.

In the step of generating an output voltage (S850), the first level voltage VH or the second level voltage VL is received, and a voltage interpolated by the currents transmitted through the first transmission line and the second transmission line is added, by which an output voltage is generated.

That is to say, a voltage interpolated between the first level voltage VH and the second level voltage VL is obtained through the coarse interpolation on the first transmission line and the fine interpolation on the second transmission line. The voltage obtained in this way is added to the first level voltage VH or the second level voltage VL, whereby the output voltage is generated.

In the case where the output buffer amplification section 550 receives the first level voltage VH, the output voltage is generated by adding the voltage interpolated by the currents transmitted through the first transmission line and the second transmission line in a negative direction. In the case where the output buffer amplification section 550 receives the second level voltage VL, the output voltage is generated by adding the voltage interpolated by the currents transmitted through the first transmission line and the second transmission line in a positive direction.

After the step of performing transmission through the second transmission line (S840), by changing the transmission paths of the first transmission line and the second transmission line through switch control, input image data of lower bits can be efficiently converted into an analog signal.

As is apparent from the above description, in a digital-to-analog converter of a data driver according to the present invention, input data corresponding to a lower bit is converted into an analog signal through control of current transmission paths and control of a transconductance ratio between a delta current generation section and an output buffer amplifier. As a consequence, not only the area of a data driver can be significantly reduced, but also the delta current generation section can be realized even without using a common node feedback circuit, whereby an additional increase in area is not caused.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A digital-to-analog converter of a data driver, comprising:
    a decoder configured to output a first level voltage and a second level voltage in response to input image data of upper K bits (K is a natural number less than N) among input image data of N bits (N is a natural number equal to or greater than 2);
    a delta current generation section configured to receive the first level voltage and the second level voltage and generate two currents;
    two transmission lines configured to transmit the two currents generated by the delta current generation section;
    a current digital-to-analog conversion section configured to divide one current of the two currents generated by the delta current generation section, in response to input image data of 2 least significant bits among remaining lower L bits (L=N−K);
    an output buffer amplification section configured to be applied with the other current of the two currents generated by the delta current generation section and a current outputted from the current digital-to-analog conversion section and generate an output voltage;
    a switch section configured to control currents of the transmission lines depending upon input information; and
    two multipliers configured to control transmission paths of the two currents generated by the delta current generation section.

2. The digital-to-analog converter according to claim 1, wherein the delta current generation section comprises a first amplifier, and
    wherein the first amplifier is a differential output amplifier having a first input terminal to which the first level voltage is applied, a second input terminal to which the second level voltage is applied, a first output terminal which generates a negative output current, and a second output terminal which generates a positive output current.

3. The digital-to-analog converter according to claim 2, wherein the transmission lines comprise:
    a first transmission line configured to apply the negative output current to the output buffer amplification section; and
    a second transmission line configured to apply the positive output current to the output buffer amplification section via the current digital-to-analog conversion section.

4. The digital-to-analog converter according to claim 3, wherein the first transmission line performs a coarse interpolation, and the second transmission line performs a fine interpolation.

5. The digital-to-analog converter according to claim 3, wherein the output buffer amplification section comprises:
    a second amplifier having an inverting terminal to which the second level voltage or the first level voltage is applied;
    an adder configured to add an output of the second amplifier and a voltage which is interpolated by the current applied from the first transmission line or the current applied from the second transmission line; and
    an internal amplifier configured to amplify an output of the adder and generate the output voltage.

6. The digital-to-analog converter according to claim 5, wherein the second amplifier has a transconductance corresponding to two times of a transconductance of the first amplifier.

7. The digital-to-analog converter according to claim 6, wherein the current digital-to-analog conversion section uses a 2-bit current digital-to-analog converter.

8. The digital-to-analog converter according to claim 1, wherein the decoder uses a 6-bit resistor string digital-to-analog converter.

9. A digital-to-analog converting method of a data driver, comprising the steps of:
    (a) outputting a first level voltage and a second level voltage in response to input image data of upper K bits (K is a natural number less than N) among input image data of N bits (N is a natural number equal to or greater than 2);
    (b) receiving the first level voltage and the second level voltage and generating a negative output current and a positive output current;
    (c) transmitting one current of the negative output current and the positive output current through a first transmission line;
    (d) transmitting the other current of the negative output current and the positive output current through a second transmission line, by dividing the other current depending upon input image data of remaining lower L bits (L=N−K) through a current digital-to-analog converter; and
    (e) receiving the first level voltage or the second level voltage, adding the first level voltage or the second level voltage with a voltage which is interpolated by the currents transmitted through the first transmission line and the second transmission line, and generating an output voltage.

10. The method according to claim 9, wherein, after the step (d), the method further comprises the step of:
    (d1) changing transmission paths of the first transmission line and the second transmission line.

11. The method according to claim 9, wherein the step (a) uses a 6-bit resistor string digital-to-analog converter.

12. The method according to claim 9, wherein the step (c) performs a coarse interpolation through the first transmission line.

13. The method according to claim 9, wherein the step (d) performs a fine interpolation through the second transmission line and uses a 2-bit current digital-to-analog converter.

14. The method according to claim 9, wherein, in the step (e), in the case where the first level voltage is received, the voltage which is interpolated by the currents transmitted through the first transmission line and the second transmission line is added in a negative direction so that the output voltage is generated, and in the case where the second level voltage is received, the voltage which is interpolated by the currents transmitted through the first transmission line and the second transmission line is added in a positive direction so that the output voltage is generated.

15. The method according to claim 10, wherein the step (a) uses a 6-bit resistor string digital-to-analog converter.

16. The method according to claim 10, wherein the step (c) performs a coarse interpolation through the first transmission line.

17. The method according to claim 10, wherein the step (d) performs a fine interpolation through the second transmission line and uses a 2-bit current digital-to-analog converter.

18. The method according to claim 10, wherein, in the step (e), in the case where the first level voltage is received, the voltage which is interpolated by the currents transmitted through the first transmission line and the second transmission line is added in a negative direction so that the output voltage is generated, and in the case where the second level voltage is received, the voltage which is interpolated by the currents transmitted through the first transmission line and the second transmission line is added in a positive direction so that the output voltage is generated.

* * * * *